United States Patent
Kang

(10) Patent No.: US 9,312,486 B2
(45) Date of Patent: Apr. 12, 2016

(54) METHOD FOR FABRICATING ORGANIC LIGHT EMITTING DISPLAY DEVICE BY PREDEPOSITING A SOLVENT TO INCREASE WETTABILITY AND INKJET PRINT DEVICE USED THEREIN

(71) Applicant: SAMSUNG DISPLAY CO., LTD., Yongin, Gyeonggi-Do (KR)

(72) Inventor: Yoon Ho Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/944,643

(22) Filed: Jul. 17, 2013

(65) Prior Publication Data

US 2014/0206119 A1    Jul. 24, 2014

(30) Foreign Application Priority Data

Jan. 18, 2013 (KR) .................. 10-2013-0006005

(51) Int. Cl.
*H01L 51/00* (2006.01)
*H01L 51/56* (2006.01)

(52) U.S. Cl.
CPC ........ *H01L 51/0005* (2013.01); *H01L 51/0012* (2013.01); *H01L 51/56* (2013.01); *H01L 51/0007* (2013.01)

(58) Field of Classification Search
CPC . H01L 51/56; H01L 51/0005; H01L 51/0007; H01L 51/0012
USPC ........................................................ 438/34
See application file for complete search history.

(56) References Cited

U.S. PATENT DOCUMENTS

| 2004/0232814 | A1* | 11/2004 | Sakai | 313/310 |
| 2006/0220543 | A1* | 10/2006 | Makiura | 313/506 |
| 2006/0228466 | A1* | 10/2006 | Yu et al. | 427/64 |
| 2007/0248746 | A1* | 10/2007 | Ito et al. | 427/64 |
| 2010/0240160 | A1* | 9/2010 | Lee et al. | 438/34 |

FOREIGN PATENT DOCUMENTS

| KR | 10-2006-0034870 A | 4/2006 |
| KR | 10-2007-0052505 | 5/2007 |
| KR | 10-2009-0000525 | 1/2009 |

OTHER PUBLICATIONS

Eastman material safety data sheet for Cyclohexylbenzene, available at http://ws.eastman.com/ProductCatalogApps/PageControllers/MSDS_PC.aspx?Product=71093424.*
Haltermann product safety bulletin for isopropyl alcohol, available at http://www.monumentchemical.com/documents/IPA_Data_and_Safety_Sheet.pdf.*

* cited by examiner

*Primary Examiner* — Peter Bradford
(74) *Attorney, Agent, or Firm* — Lewis Roca Rothgerber Christie LLP

(57) ABSTRACT

A method for fabricating an organic light emitting display device includes forming a first electrode on a substrate; forming a pixel-defining film having an opening exposing the first electrode; forming an ink non-reactive solvent portion by discharging of an ink non-reactive solvent at the opening and forming an organic light emitting layer by discharging an organic light emitting ink on the ink non-reactive solvent portion; and forming a second electrode on the organic light emitting layer.

5 Claims, 14 Drawing Sheets

METHOD FOR FABRICATING ORGANIC LIGHT EMITTING DISPLAY DEVICE BY PREDEPOSITING A SOLVENT TO INCREASE WETTABILITY AND INKJET PRINT DEVICE USED THEREIN

CROSS-REFERENCE TO RELATED APPLICATIONS

This application claims priority to and the benefit of Korean Patent Application No. 10-2013-0006005, filed on Jan. 18, 2013 in the Korean Intellectual Property Office, the disclosure of which is incorporated herein in its entirety by reference.

BACKGROUND

1. Field

The present invention relates to a method for fabricating an organic light emitting display device and an inkjet print device used therein.

2. Description of Related Art

Flat panel display devices may be classified as an emissive-type or a non-emissive type. An emissive-type display device may be a flat cathode ray tube, a plasma display panel, an electroluminescence device, or a light emitting diode. A non-emissive type display device may be a liquid crystal display. Among them, the electroluminescence device has advantages including wide viewing angle, superior contrast, and high response speed, and thus, has been in the spotlight as a next-generation display device. The electroluminescence device is classified into either an inorganic light emitting device or an organic light emitting device depending on the material that forms a light emitting layer.

The organic light emitting device includes an organic light emitting layer which is made of an organic material disposed between an anode electrode and a cathode electrode. If voltages are applied to these electrodes, respectively, holes injected from the anode electrode move to the organic light emitting layer through a hole injection layer and a hole transport layer, and electrons move to the organic light emitting layer through an electron injection layer and an electron transport layer. In the organic light emitting layer, the electrons and the holes are recombined. Through this recombination, excitons are generated, and as the excitons are changed from an excited state to a ground state, the organic light emitting layer emits light to display an image.

The organic light emitting device includes a pixel-defining film having an opening for exposing the anode electrode, and the organic light emitting layer is formed on the anode electrode that is exposed through the opening of the pixel-defining film.

SUMMARY

The organic light emitting layer may be formed by discharging organic light emitting ink on the anode electrode that is exposed through the opening of the pixel-defining film using an inkjet printing method.

However, after forming the pixel-defining film, fine residual substances which are invisible to the naked eye may remain on the anode electrode, and such fine residual substances may affect or deteriorate wetting of the organic light emitting ink that is discharged on the anode electrode. In this case, the thickness of the organic light emitting layer which is formed by discharging the organic light emitting ink in the opening (e.g., in the inside of the opening) of the pixel-defining film may be non-uniform.

Accordingly, it is desirable to provide a method for fabricating an organic light emitting display device which can achieve uniform light emission by forming the organic light emitting layer with a uniform thickness through improved wetting of the organic light emitting ink that is discharged in the opening of the pixel-defining film.

Furthermore, it is desirable to provide an inkjet print device which can achieve more uniform light emission by forming the organic light emitting layer with a substantially uniform thickness through improved wetting of the organic light emitting ink that is discharged in the opening of the pixel-defining film.

Additional aspects and features of the invention will be set forth in part in the description which follows and in part will become apparent to those having ordinary skill in the art upon examination of the following or may be learned from practice of the invention.

According to one embodiment of the present invention, a method for fabricating an organic light emitting display device includes forming a first electrode on a substrate; forming a pixel-defining film having an opening exposing the first electrode; forming an ink non-reactive solvent portion by discharging an ink non-reactive solvent at the opening and forming an organic light emitting layer by discharging an organic light emitting ink on the ink non-reactive solvent portion; and forming a second electrode on the organic light emitting layer.

The opening of the pixel-defining film may have a rectangular shape.

The opening of the pixel-defining film may have rounded corners.

The ink non-reactive solvent may include a solvent which is non-reactive with the organic light emitting ink, may be transparent, and may have a boiling point that is equal to or higher than about 70° C.

The ink non-reactive solvent may include at least one of alcohol, dipropylene glycol monomethyl ether acetate (DPMA), ethyl acetate, n-butyl acetate, isobutyl acetate, ethylene glycol monomethyl ether acetate, ethylene glycol n-butyl ether acetate, diethylene glycol dimethyl ether, dipropylene glycol monomthyl ether acetate, diethylene glycol methyl ethyl ether, diethylene glycol ethyl ether acetate, dipropylene glycol n-butyl ether, tripropylene glycol n-propyl ether, tripropylene glycol methyl ether, propylene glycol methyl ether acetate, propylene glycol diacetate, propylene glycol monomethyl ether, propylene glycol monoethyl ether acetate, cyclohexanone, 3-methoxy propionic acid ethyl, 3-ethoxy propionic acid methyl, 3-ethoxy propionic acid ethyl, ethylene glycol n-butyl ether acetate (EGBEA), dipropylene glycol monomethyl ether acetate (DPMA), propylene glycol diacetate (PGDA), diethylene glycol monoethyl ether (DPGME), or diethyl glycol monoethyl ether (Carbitol).

Viscosity of the ink non-reactive solvent may be in a range from about 2 centi-poise (cP) to about 4 cP.

The method for fabricating an organic light emitting display may further include defining each pixel, and discharging the ink non-reactive solvent for each pixel line or concurrently with respect to all pixels using an inkjet print method or a nozzle print method.

The ink non-reactive solvent may be discharged using a spray coating method or a dipping method.

The ink non-reactive solvent portion may substantially cover the first electrode and an upper surface of the pixel-defining film and may have a substantially constant thickness.

The ink non-reactive solvent portion may have a first thickness on the first electrode, and may have a second thickness on an upper surface of the pixel-defining film, the second thickness may be greater than the first thickness.

The organic light emitting ink may include a solvent and solids, and the solvent of the organic light emitting ink may be the same as or different from the ink non-reactive solvent.

The organic light emitting layer may include a hole injection layer, a hole transport layer, an organic layer, an electron transport layer, and an electron injection layer, which are stacked on the first electrode, and the solids may include any material constituting the hole injection layer, the hole transport layer, the organic layer, the electron transport layer, and the electron injection layer.

The solvents of the ink non-reactive solvent portion and the organic light emitting ink may be mixed by discharging the organic light emitting ink on the ink non-reactive solvent portion.

The mixed solvents of the ink non-reactive solvent portion and the organic light emitting ink may be substantially evaporated, and the solids of the organic light emitting ink may remain as the organic light emitting layer.

The organic light emitting ink may be discharged some time after when discharging the ink non-reactive solvent is completed.

The ink non-reactive solvent may be discharged through an ink non-reactive solvent discharge mechanism including a first nozzle at a lower portion of a first head, and the organic light emitting ink may be discharged through an organic light emitting ink discharge mechanism including a second nozzle at a lower portion of a second head.

The ink non-reactive solvent discharge mechanism and the organic light emitting ink discharge mechanism may be independently controlled or may be configured to move concurrently.

An inkjet print device includes an ink non-reactive solvent discharge mechanism configured to form an ink non-reactive solvent portion by discharging ink non-reactive ink in an opening of a pixel-defining film, the opening exposing a first electrode on a substrate of an organic light emitting display device; and an organic light emitting ink discharge mechanism configured to form an organic light emitting layer by discharging an organic light emitting ink on the ink non-reactive solvent portion.

The ink non-reactive solvent discharge mechanism may include a first controller configured to control discharge of an ink non-reactive solvent and movement of a first discharger; an ink non-reactive solvent storage configured to store the ink non-reactive solvent; and the first discharger configured to receive a discharge control signal and a movement control signal from the first controller, to receive the ink non-reactive solvent from the ink non-reactive solvent storage, and to discharge the ink non-reactive solvent on the first electrode.

The organic light emitting ink discharge mechanism may include a second controller configured to control discharge of the organic light emitting ink and movement of a second discharger; an organic light emitting ink storage configured to store the organic light emitting ink; and the second discharger configured to receive a discharge control signal and a movement control signal from the second controller, to receive the organic light emitting ink from the organic light emitting ink storage, and to discharge the organic light emitting ink on the ink non-reactive solvent portion.

The first discharger may include a first nozzle at a lower portion of a first head, and the second discharger may include a second nozzle at a lower portion of a second head, and the first head and the second head are respectively coupled to moving devices that are configured to move independently with respect to each other.

The first discharger may include a first nozzle at a lower portion of a first head, and the second discharger may include a second nozzle at a lower portion of a second head, and the first head and the second head may be coupled to one moving device.

A distance between the first nozzle and the second nozzle may be substantially equal to a width of a pixel.

Accordingly, even if the fine residual substances remain after forming the pixel-defining film on the first electrode, the fine residual substances are prevented from limiting the wetting of the organic light emitting ink, and thus, the wetting of the organic light emitting ink can be improved.

Accordingly, by adjusting the thickness of the organic light emitting ink in the opening of the pixel-defining film, the organic light emitting layer is formed on the first electrode with a substantially uniform thickness, and thus, the display quality of the organic light emitting display device can be improved through uniform light emission of the organic light emitting layer.

The aspects and effects according to the present invention are not limited to the contents as exemplified above, but further various aspects and effects are included in the description.

BRIEF DESCRIPTION OF THE DRAWINGS

The above and other features and aspects of the present invention will be more apparent from the following detailed description taken in conjunction with the accompanying drawings, in which.

DETAILED DESCRIPTION

Aspects and features of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present invention.

Hereinafter, embodiments of the present invention will be described with reference to the accompanying drawings.

Figure 1:
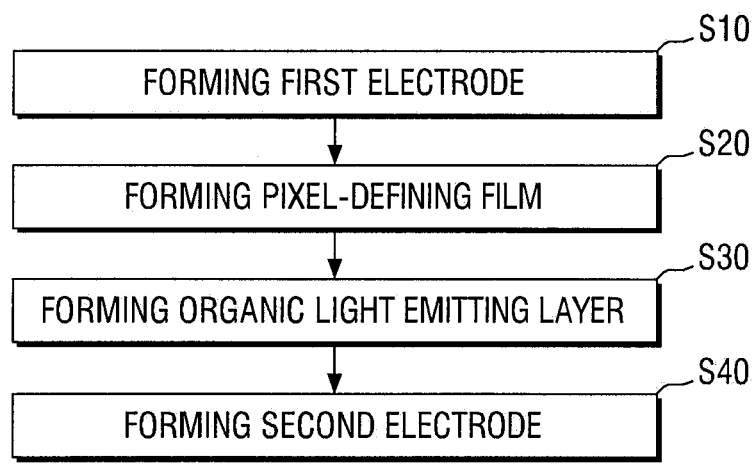
FIG. 1 is a flowchart depicting a method for fabricating an organic light emitting display device according to an embodiment of the present invention.
Figure 2:
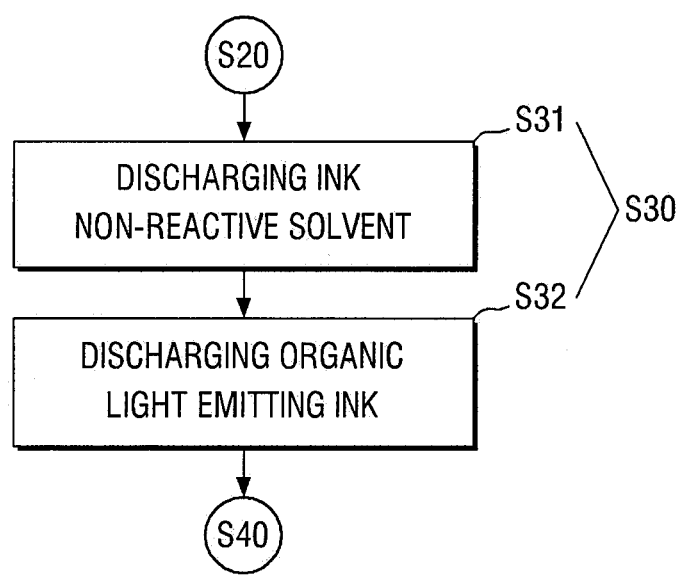
FIG. 2 is a flowchart depicting an organic light emitting layer forming step of the method for fabricating an organic light emitting display device according to an embodiment of the present invention.

FIG. 1 is a flowchart of a method for fabricating an organic light emitting display device according to an embodiment of the present invention, and FIG. 2 is a flowchart of an organic light emitting layer forming step of the method for fabricating an organic light emitting display device according to an embodiment of the present invention. FIGS. 3 to 9 are cross-sectional views and a plan view of processing steps of a method for fabricating an organic light emitting display device according to an embodiment of the present invention.

A method for fabricating an organic light emitting display device according to an embodiment of the present invention includes a first electrode forming step (S10), a pixel-defining film forming step (S20), an organic light emitting layer forming step (S30), and a second electrode forming step (S40).

Figure 3:
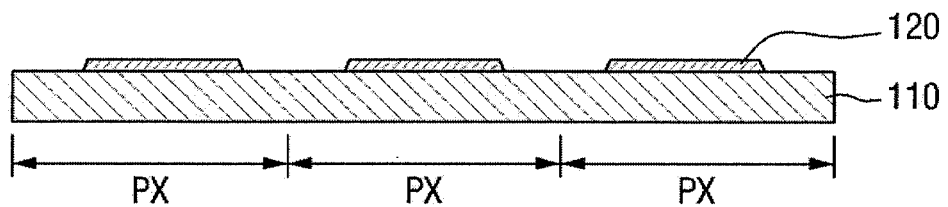
FIGS. 3 to 9 are cross-sectional views and a plan view of processing steps of a method for fabricating an organic light emitting display device according to an embodiment of the present invention.

First, referring to FIGS. 1 and 3, the first electrode forming step (S10) is a step of forming a first electrode 120 on a substrate 110. The first electrode 120 may be used as an anode electrode for providing holes or as a cathode electrode for providing electrons.

The substrate 110 may include an insulating substrate. The substrate 110 (e.g., insulating substrate) may be formed of a transparent glass material having $SiO_2$ as a main component. In some embodiments, the substrate 110 may be made of an opaque material or a plastic material. Further, the substrate 110 may be flexible.

A material layer of the first electrode is formed on the substrate 110. In the case where the first electrode 120 is used as the transparent electrode, the material layer of the first electrode may include indium tin oxide (ITO), indium zinc oxide (IZO), zinc oxide (ZnO), or indium oxide ($In_2O_3$). Further, in the case where the first electrode 120 is used as the reflection electrode, the material layer of the first electrode may include (e.g., be formed by forming) at least one layer selected from the group including Ag, Mg, Al, Pt, Pd, Au, Ni, Nd, Ir, Cr, or compounds thereof and then forming at least one layer selected from the group including ITO, IZO, ZnO, or $In_2O_3$ thereon. The material layer of the first electrode may be formed using a method, such as Chemical Vapor Deposition (CVD) or Physical Vapor Deposition (PVD).

Then, the material layer of the first electrode is patterned according to each pixel PX to form the first electrode 120. The material layer of the first electrode may be patterned through, for example, a photo etching process.

In another embodiment of the present invention, the first electrode 120 may be formed through direct printing using an inkjet printing or gravure printing method. In this case, the photo etching process may be omitted.

Figure 4:
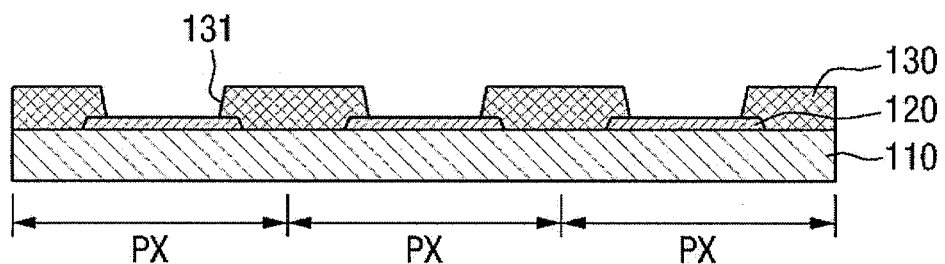

Referring to FIGS. 1 and 4, the pixel-defining film forming step (S20) is a step of forming a pixel-defining film 130 on the substrate 110 on which the first electrode 120 is formed. More specifically, a material layer of the pixel-defining film is first formed on the entire or whole surface of a resultant material of FIG. 3 (e.g., the entire exposed surfaces of the first electrode 120 and the substrate 110). The material layer of the pixel-defining film may include an insulating material, for example, at least one organic material selected from the group including benzocyclobutene (BCB), polyimide (PI), polyamide (PA), acrylic resin, and phenol resin. Further, as another example, the material layer of the pixel-defining film may include an inorganic material, such as silicon nitride. The material layer of the pixel-defining film may be formed using a method, such as CVD (Chemical Vapor Deposition) or PVD (Physical Vapor Deposition).

Figure 5:
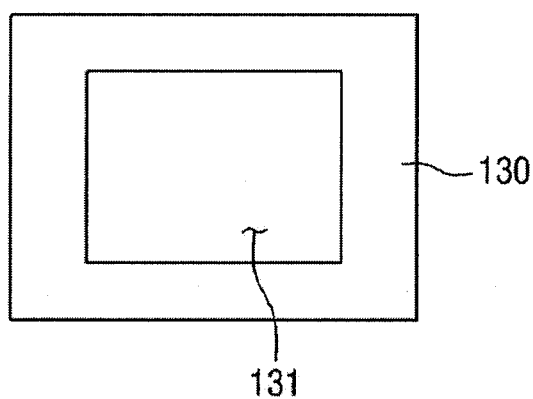

Then, the pixel-defining film 130 having an opening 131 is formed by patterning the material layer of the pixel-defining film so that the material layer of the pixel-defining material defines each pixel PX. The material layer of the pixel-defining film may be patterned by, for example, a photo etching process. Referring to FIG. 5, in each pixel PX, the opening 131 of the pixel-defining film 130 may have a rectangular plane shape (e.g., planar rectangle shape). That is, an angle formed by adjacent side walls of the opening 131 may be a right angle.

In another embodiment of the present invention, the pixel-defining film 130 may be formed through direct printing using an inkjet printing or gravure printing method. In this case, the photo etching process may be omitted.

Referring to FIGS. 1, 2, and 6 to 8, the organic light emitting layer forming step (S30) includes forming an organic light emitting layer 140 on the first electrode 120 that is exposed through the opening 131 of the pixel-defining film 130. The organic light emitting layer 140 may include a hole injection layer formed on the first electrode 120, a hole transport layer formed on the hole injection layer, an organic layer formed on the hole transport layer, an electron transport layer formed on the organic layer, and an electron injection layer formed on the electron transport layer. Holes provided from the first electrode 120 through the hole injection layer and the hole transport layer and electrons provided from a second electrode 150 through the electron injection layer and the electron transport layer are combined with each other in the organic layer to emit light.

The organic light emitting layer forming step (S30) may include an ink non-reactive solvent discharge step (S31) and an organic light emitting ink discharge step (S32).

Figure 6:
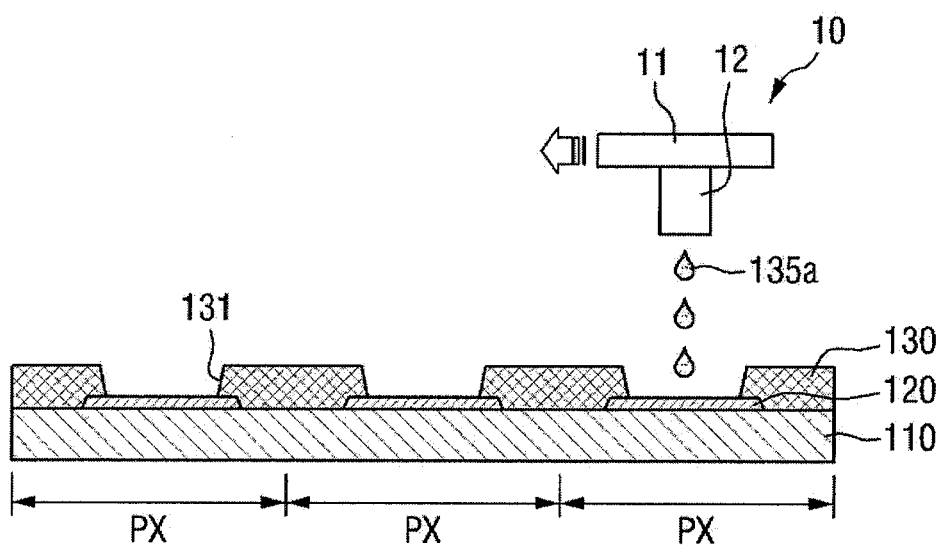

As illustrated in FIG. 6, the ink non-reactive solvent discharge step (S31) includes discharging an ink non-reactive solvent 135a on or onto the first electrode 120. Discharging the ink non-reactive solvent 135a may be performed by an inkjet print method using an ink non-reactive solvent discharge mechanism or portion 10 which includes a plurality of first nozzles 12 at (e.g., installed at) a lower portion of a first head 11 (e.g., below a first head 11). Further, discharging the ink non-reactive solvent 135a may be performed for each pixel line as the first head 11 moves in one direction. The first head 11 may include a thermal inkjet print head or a piezo inkjet print head. In some embodiments, discharging the ink non-reactive solvent 135a may be performed by or using a nozzle print method.

The ink non-reactive solvent 135a is a solvent which improves wetting of organic light emitting ink 140a during discharging of the organic light emitting ink 140a on or onto the first electrode 120, is non-reactive with or to the organic light emitting ink 140a, and may be used (e.g., selected) as a transparent solvent. Further, the ink non-reactive solvent 135a may have a boiling point that is equal to or higher than about 70° C. so that the ink non-reactive solvent 135a remains on the first electrode 120 without evaporating before or when the organic light emitting ink 140a is discharged on or onto the first electrode 120. If the boiling point of the ink non-reactive solvent 135a is equal to or higher than about 70° C., the ink non-reactive solvent 135a can also be prevented from evaporating before the organic light emitting ink 140a is discharged on or onto the first electrode 120.

As described above, the ink non-reactive solvent 135a, which is non-reactive with or to the organic light emitting ink 140a, is transparent, and has a boiling point that is equal to or higher than about 70° C. The ink non-reactive solvent 135a may, for example, include at least one selected from the group including alcohol, dipropylene glycol monomethyl ether acetate (DPMA), ethyl acetate, n-butyl acetate, isobutyl acetate, ethylene glycol monomethyl ether acetate, ethylene glycol n-butyl ether acetate, diethylene glycol dimethyl ether, dipropylene glycol monomthyl ether acetate, diethylene glycol methyl ethyl ether, diethylene glycol ethyl ether acetate, dipropylene glycol n-butyl ether, tripropylene glycol n-propyl ether, tripropylene glycol methyl ether, propylene glycol methyl ether acetate, propylene glycol diacetate, propylene glycol monomethyl ether, propylene glycol monoethyl ether acetate, cyclohexanone, 3-methoxy propionic acid ethyl, 3-ethoxy propionic acid methyl, 3-ethoxy propionic acid ethyl, ethylene glycol n-butyl ether acetate (EGBEA), dipropylene glycol monomethyl ether acetate (DPMA), propylene glycol diacetate (PGDA), diethylene glycol monoethyl ether (DPGME), or diethyl glycol monoethyl ether (Carbitol).

Further, the ink non-reactive solvent 135a may have viscosity in a range of about 2 centi-poise (cP) to about 4 (cP) when it is discharged using or through the first nozzle 12. In the above-described viscosity range, the ink non-reactive solvent 135a can flow (e.g., flow smoothly) in or through the first nozzle 12.

Figure 7:
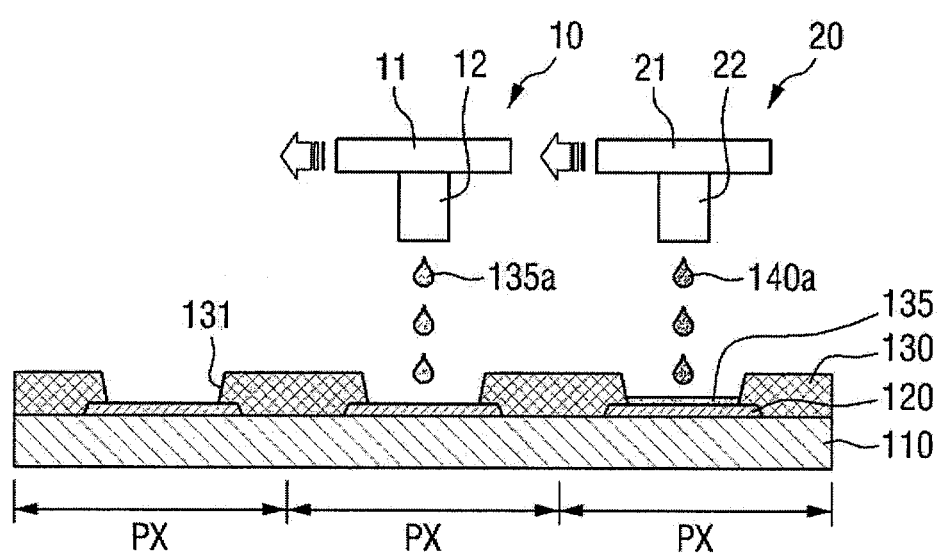

As illustrated in FIG. 7, the organic light emitting ink discharge step (S32) includes discharging the organic light emitting ink 140a on or onto the ink non-reactive solvent portion 135 that is formed as the ink non-reactive solvent 135a is discharged on or onto the first electrode 120.

Even if the fine residual substances remain on the first electrode 120 after forming the pixel-defining film 130, the organic light emitting ink 140a is discharged on or onto the ink non-reactive solvent portion 135 formed thereon, and thus, the fine residual substances are prevented from limiting (e.g., directly limiting) the wetting of the organic light emitting ink 140a.

The organic light emitting ink 140a may include a solvent and solids. The solvent may be the same as or may be different from the ink non-reactive solvent 135a. The solid may include a material of (e.g., constituting) any one of the hole injection layer, the hole transport layer, the organic layer, the electron transport layer, and the electron injection layer, which are stacked (e.g., mutually stacked) on the first electrode 120. For example, if the solid is a material of the hole injection layer, it may be 4,4',4"-tris(3-methylphenylphenylamino)triphenylamine (MTDATA), copper phthalocyanine (CuPc), or poly(3,4-ethylenedioxythiphene)/(polystyrene sulfonate) (PEDOT/PSS), but is not limited thereto.

The organic light emitting ink 140a includes the solvent, and if it is discharged on or onto the ink non-reactive solvent portion 135, it is mixed with the ink non-reactive solvent portion 135 in a liquid state. Through this mixing, wetting of the organic light emitting ink 140a can be improved in the opening 131 of the pixel-defining film 130.

Discharging the organic light emitting ink 140a may be performed by or using the inkjet print method using an organic light emitting ink discharge mechanism or portion 20 that includes a plurality of second nozzles 22 on (e.g., installed at) the lower portion of a second head 21 (e.g., the bottom of a second head 21). Further, discharging the organic light emitting ink 140a may be performed for each pixel line as the second head 21 moves in a direction (e.g., one direction). The second head 21 may be a thermal inkjet print head or a piezo inkjet print head. In some embodiments, discharging the organic light emitting ink 140a may be performed by or using the nozzle print method.

Discharging the organic light emitting ink 140a on the ink non-reactive solvent portion 135 may be performed after a time (e.g., predetermined time), for example, between about two to about five seconds after discharging the ink non-reactive solvent 135a is completed. In such a time range, the ink non-reactive solvent portion 135, which is formed through or by discharging the ink non-reactive solvent 135a on the first electrode 120, can be prevented from becoming dried or evaporated. However, the present invention is not limited thereto. The time (e.g., predetermined time) between discharging the ink non-reactive solvent 135a and discharging the organic light emitting ink 140a may be determined (e.g., calculated) by experiments based on the time before the ink non-reactive solvent portion 135 is dried or evaporated from the first electrode 120.

As or after a discharge time of the organic light emitting ink 140a elapses (e.g., passes), the ink non-reactive solvent discharge mechanism 10 moves to an adjacent pixel PX after discharging the ink non-reactive solvent 135a on or onto the first electrode 120, and the organic light emitting ink discharge mechanism 20 moves to be above the ink non-reactive solvent portion 135 (e.g., to the upper side of the ink non-reactive solvent portion 135) formed by the ink non-reactive solvent 135a. Further, the organic light emitting ink discharge mechanism 20 discharges the organic light emitting ink 140a on or onto the ink non-reactive solvent portion 135.

The movement of the ink non-reactive solvent discharge mechanism 10 and the movement of the organic light emitting ink discharge mechanism 20 may be performed in one direction and/or may be independently controlled. In some embodiments, the movement of the ink non-reactive solvent discharge mechanism 10 and the movement of the organic light emitting ink discharge mechanism 20 may be performed (e.g., simultaneously or concurrently performed) when the first head 11 of the ink non-reactive solvent discharge mechanism 10 and the second head 21 of the organic light emitting ink discharge mechanism 20 are coupled to a moving device.

Figure 8:
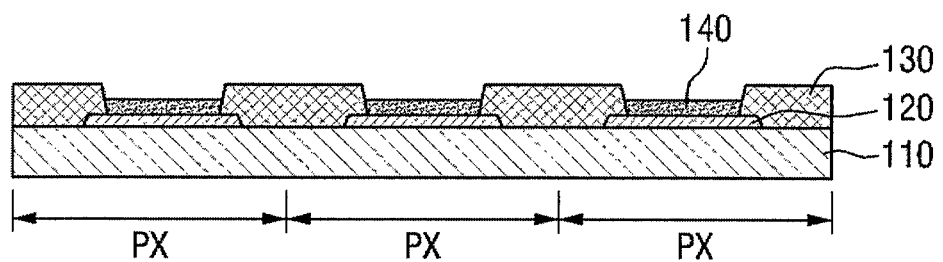

Through the movement of the organic light emitting ink discharge mechanism 20, the organic light emitting ink 140a is discharged on or onto the ink non-reactive solvent portion 135 of all pixels PX to form the organic light emitting layer 140 as illustrated in FIG. 8. The solvent of the ink non-reactive solvent portion 135 and the solvent of the organic light emitting ink 140a, which are mixed due to the discharging of the organic light emitting ink 140a, are all evaporated (e.g., completely evaporated) and the solids of the organic light emitting ink 140a remain as the organic light emitting layer 140.

Figure 9:
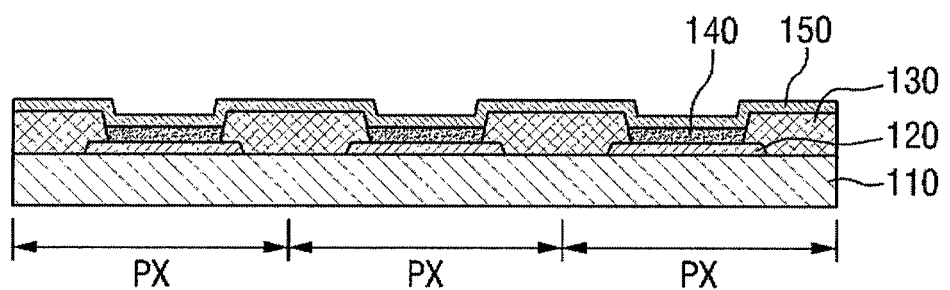

Referring to FIGS. 1 and 9, the second electrode forming step (S40) is a step of forming the second electrode 150 on the organic light emitting layer 140. The second electrode 150 may be used as a cathode electrode for providing electrons or an anode electrode for providing holes.

More specifically, the second electrode forming step (S40) includes forming the second electrode 150 by forming a material layer of the second electrode on the entire surfaces (e.g., entire exposed surfaces) of both the organic light emitting layer 140 and the pixel-defining film 130. In the case where the second electrode 150 is used (e.g., formed) as the transparent electrode, the material layer of the second electrode may include indium tin oxide (ITO), indium zinc oxide (IZO), zinc oxide (ZnO), or indium oxide (In$_2$O$_3$). Further, in the case where the second electrode 150 is used (e.g., formed) as the reflection electrode, the material layer of the second electrode may include (e.g., be formed by forming) at least one layer selected from the group including Ag, Mg, Al, Pt, Pd, Au, Ni, Nd, Ir, Cr, or compounds thereof and then forming at least one layer selected from the group including ITO, IZO, ZnO, or In$_2$O$_3$ thereon. The material layer of the second electrode may be formed using a method, such as Chemical Vapor Deposition (CVD) or Physical Vapor Deposition (PVD).

In some embodiments, the second electrode 150 may be formed to have different patterns by patterning the material layer of the second electrode.

Although not illustrated, the method for fabricating an organic light emitting display device according to an embodiment of the present invention may further include a step of placing (e.g., arranging) a sealing substrate on the upper portion of the second electrode 150 (e.g., at the top of the second electrode 150). Further, the method for fabricating an organic light emitting display device according to an embodiment of the present invention may further include a step of placing (e.g., arranging) spacers between the second electrode 150 and the sealing substrate.

As described above, according to the method for fabricating an organic light emitting display device according to an embodiment of the present invention, the organic light emitting ink 140a is discharged on or onto the ink non-reactive solvent portion 135 that is formed through discharging the ink non-reactive solvent 135a to form the organic light emitting layer 140. That is, even if the fine residual substances remain on the first electrode 120 after the process of forming the pixel-defining film 130, the organic light emitting ink 140a is discharged after the ink non-reactive solvent portion 135 is formed thereon, and thus, the fine residual substances are prevented from limiting (e.g., directly limiting) the wetting of the organic light emitting ink 140a. Accordingly, the wetting of the organic light emitting ink 140a can be improved.

If the wetting of the discharged organic light emitting ink 140a is improved, the thickness of the organic light emitting ink 140a can be adjusted (e.g., uniformly adjusted) in the opening 131. Accordingly, the organic light emitting layer 140 can be formed on the first electrode 120 having (e.g., with) a substantially uniform thickness, and thus, the display quality of the organic light emitting display device can be improved through substantially uniform light emission of the respective organic light emitting layers 140.

Next, a method for fabricating an organic light emitting display device according to another embodiment of the present invention will be described.

Compared to the method for fabricating an organic light emitting display device according to an embodiment of the present invention as described above, the method for fabricating an organic light emitting display device according to another embodiment of the present invention includes similar steps except for a pixel-defining film forming step. Accordingly, in describing the method for fabricating an organic light emitting display device according to another embodiment of the present invention, only the pixel-defining film forming step (e.g., the step for forming the pixel-defining film 230) and an organic light emitting layer forming step are different. Therefore, only the pixel-defining film forming step and the organic light emitting layer forming step will be described in detail.

FIGS. 10 to 14 are cross-sectional views and a plan view of a pixel-defining film forming step and an organic light emitting layer forming step of a method for fabricating an organic light emitting display device according to another embodiment of the present invention.

Figure 10:
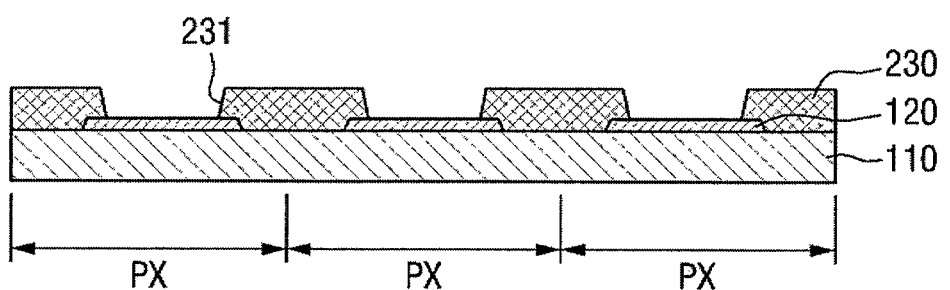
FIGS. 10 to 14 are cross-sectional views and a plan view of a pixel-defining film forming step and an organic light emitting layer forming step of a method for fabricating an organic light emitting display device according to another embodiment of the present invention.
Figure 11:
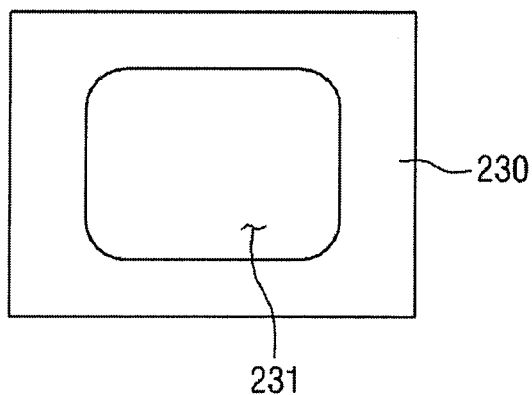

Referring to FIGS. 10 and 11, the pixel-defining film forming step in the method for fabricating an organic light emitting display device according to another embodiment of the present invention is similar to the pixel-defining film forming step (S20) as described above with reference to FIG. 4. However, in forming the pixel-defining film 230 on the substrate 110 on which the first electrode 120 is formed, as shown in FIG. 10, an opening 231 of the pixel-defining film 230 is formed so that the planar shape of the opening 231 has rounded corners in each pixel PX, as shown in FIG. 11. Accordingly, the discharged organic light emitting ink 140a can be well spread (e.g., evenly spread) up to the edges of the opening 231, and thus the filling (e.g., filling characteristic) of the organic light emitting ink 140a in the opening 231 can be improved.

The pixel-defining film forming step as shown in FIG. 10 includes forming a material layer of the pixel-defining film on the entire surface (e.g., whole exposed surface) of the resultant materials of FIG. 3 (e.g., the substrate 110 and the first electrode 120). The material layer of the pixel-defining film may be formed using a method, such as CVD or PVD. Because exemplary materials of the material layer of the pixel-defining film have been described above, duplicate explanation thereof will be omitted.

Then, the pixel-defining film 230 having the opening 231 is formed through or by patterning of the material layer of the pixel-defining film so that the material layer defines (e.g., extends along the periphery of) each pixel PX. The material layer of the pixel-defining film may, for example, be patterned through or using a photo etching process. An opening of a mask that is used for patterning of the material layer of the pixel-defining film may be formed to have rounded corners.

In another embodiment of the present invention, the pixel-defining film 230 may be formed through direct printing using an inkjet printing or gravure printing method. In this case, the photo etching process may be omitted.

Figure 12:
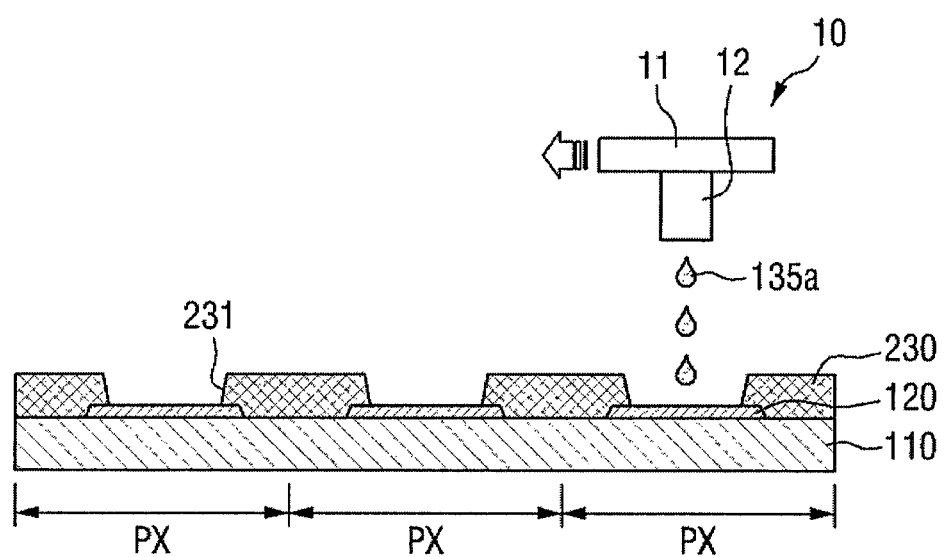
Figure 13:
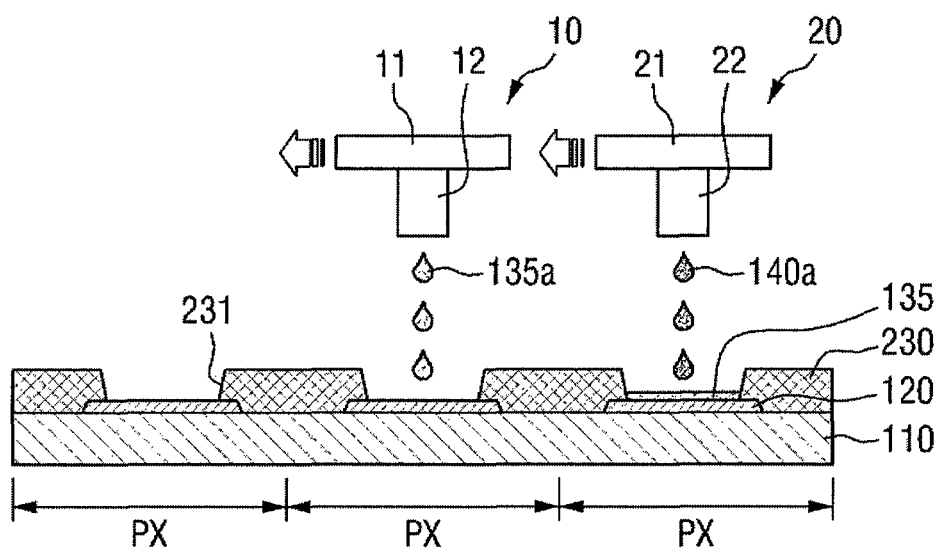
Figure 14:
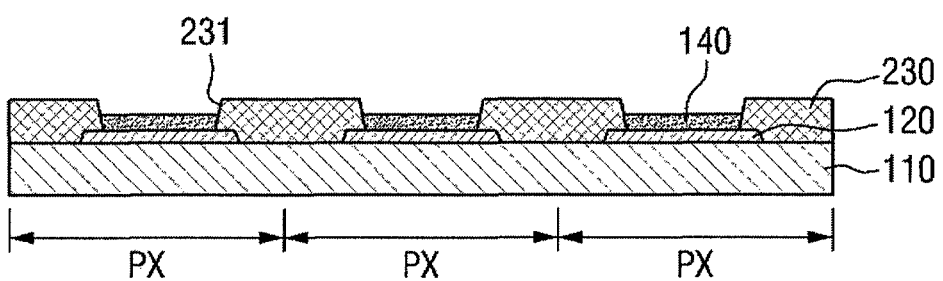

Referring to FIGS. 12 to 14, the organic light emitting layer forming step includes forming the organic light emitting layer 140 on the first electrode 120 that is exposed by the opening 231 of the pixel-defining film 230. The organic light emitting layer forming step may include an ink non-reactive solvent discharge step and an organic light emitting ink discharge step.

As illustrated in FIG. 12, the ink non-reactive solvent discharge step includes discharging the ink non-reactive solvent 135a on or onto the first electrode 120. Discharging the ink non-reactive solvent 135a may be performed using a method as illustrated in FIG. 6.

As illustrated in FIG. 13, the organic light emitting ink discharge step includes discharging the organic light emitting ink 140a on or onto the ink non-reactive solvent portion 135 that is formed through discharging the ink non-reactive solvent 135a on or onto the first electrode 120. Discharging the organic light emitting ink 140a may be performed using a method as illustrated in FIG. 7. Through the movement of the organic light emitting ink discharge mechanism 20, the organic light emitting ink 140a is discharged on or onto the ink non-reactive solvent portion 135 of all pixels PX to form the organic light emitting layer 140 as illustrated in FIG. 14. The solvent of the ink non-reactive solvent portion 135 and the solvent of the organic light emitting ink 140a, which are mixed due to the discharging of the organic light emitting ink 140a, are all evaporated (e.g., entirely evaporated) through a drying step (e.g., timed drying step) or the like, and the solids of the organic light emitting ink 140a remain as the organic light emitting layer 140.

As described above, according to the method for fabricating an organic light emitting display device according to another embodiment of the present invention, because the opening 231 of the pixel-defining film 230 is formed so that the planar shape of the opening 231 has rounded corners, the discharged organic light emitting ink 140a can be spread (e.g., well or fully spread) up to the edges of (e.g., can entire fill) the opening 231, and thus, the filling (e.g., filling characteristic) of the organic light emitting ink 140a in the opening 231 can be improved.

Next, a method for fabricating an organic light emitting display device according to still another embodiment of the present invention will be described.

Compared to the method for fabricating an organic light emitting display device according to an embodiment of the present invention as described above, the method for fabricating an organic light emitting display device according to still another embodiment of the present invention has similar steps except for an organic light emitting layer forming step. Accordingly, in describing the method for fabricating an organic light emitting display device according to still another embodiment of the present invention, only the organic light emitting layer forming step will be described.

Figure 15:
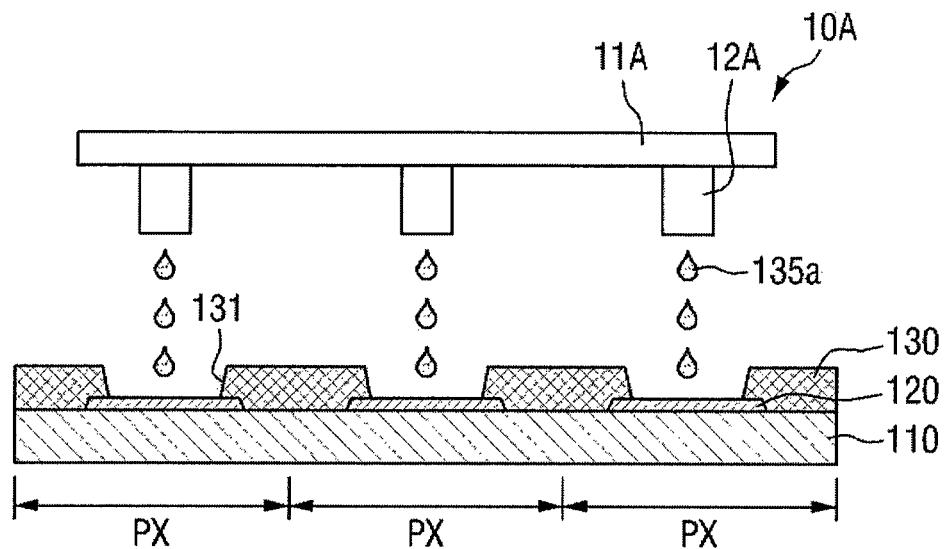
FIGS. 15 to 17 are cross-sectional views of an organic light emitting layer forming step of a method for fabricating an organic light emitting display device according to still another embodiment of the present invention.
Figure 16:
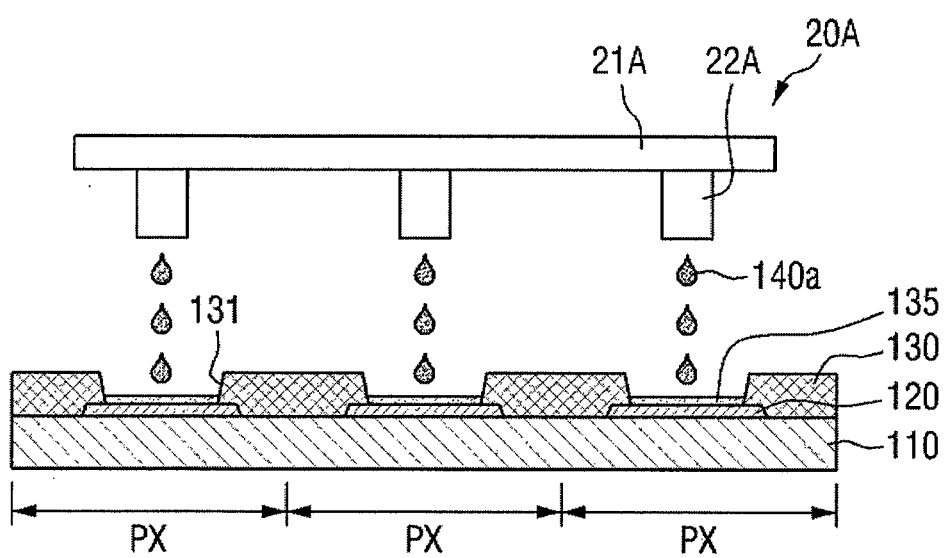
Figure 17:
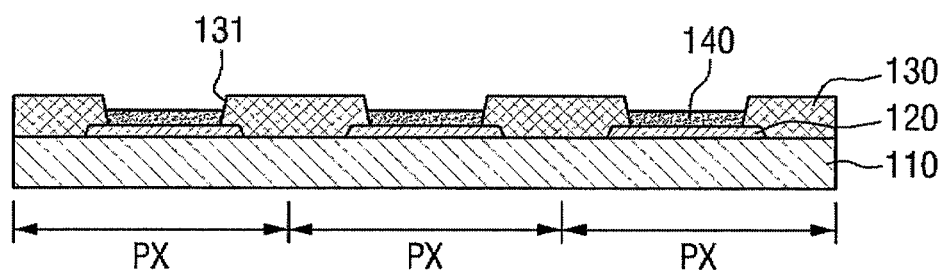

FIGS. 15 to 17 are cross-sectional views of an organic light emitting layer forming step of a method for fabricating an organic light emitting display device according to still another embodiment of the present invention.

Referring to FIGS. 15 to 17, the organic light emitting layer forming step includes forming the organic light emitting layer 140 on the first electrode 120 that is exposed by the opening 131 of the pixel-defining film 130. The organic light emitting layer forming step may include an ink non-reactive solvent discharge step and an organic light emitting ink discharge step.

As illustrated in FIG. 15, the ink non-reactive solvent discharge step includes discharging the ink non-reactive solvent 135a on or onto the first electrode 120. Discharging the ink non-reactive solvent 135a is performed (e.g., simultaneously or concurrently performed) with respect to all pixels PX by an ink non-reactive solvent discharge mechanism or portion 10A, unlike the embodiment depicted in FIG. 6, where discharging the ink non-reactive solvent 135a is performed for each pixel line as the ink non-reactive solvent discharge mechanism 10 moves relative to each pixel line. Accordingly, the ink non-reactive solvent discharge mechanism 10A can reduce the processing time of the ink non-reactive solvent discharge step. The ink non-reactive solvent discharge mechanism 10A may have a plurality of first nozzles 12A, the number of which corresponds to the number of pixels PX, on a lower portion of a first head 11A (e.g., at a bottom of a first head 11A) having a size that is similar or substantially similar to the size of the substrate 110.

As illustrated in FIG. 16, the organic light emitting ink discharge step includes discharging the organic light emitting ink 140a on or onto the ink non-reactive solvent portion 135 that is formed through discharging the ink non-reactive solvent 135a on or onto the first electrode 120. Discharging the organic light emitting ink 140a is performed (e.g., simultaneously or concurrently performed) with respect to all pixels PX by an organic light emitting ink discharge mechanism 20A, unlike the embodiment depicted in FIG. 7, where discharging the organic light emitting ink 140a is performed for each pixel line as the organic light emitting ink discharge mechanism 20 moves relative to each pixel line. Accordingly, the organic light emitting ink discharge mechanism or portion 20A can reduce the processing time of the organic light emitting ink discharge step. The organic light emitting ink discharge mechanism 20A may have a plurality of second nozzles 22A, the number of which corresponds to the number of pixels PX, on a lower portion of a second head 21A (e.g., at a bottom of a second head 21A) having a size that is similar or substantially similar to the size of the substrate 110.

Through the organic light emitting ink discharge mechanism 20A, the organic light emitting ink 140a is discharged on or onto the ink non-reactive solvent portion 135 of all pixels PX to form the organic light emitting layer 140 as illustrated in FIG. 17. The solvent of the ink non-reactive solvent portion 135 and the solvent of the organic light emitting ink 140a, which are mixed due to the discharging of the organic light emitting ink 140a, are all evaporated (e.g., entirely evaporated) through a drying step (e.g., timed drying step) or the like, and the solids of the organic light emitting ink 140a remain as the organic light emitting layer 140.

As described above, according to the method for fabricating an organic light emitting display device according to still another embodiment of the present invention, because the ink non-reactive solvent 135a is discharged (e.g., simultaneously or concurrently discharged) on or onto all the pixels PX using the ink non-reactive discharge mechanism 10A, and the organic light emitting ink 140a is discharged (e.g., simultaneously or concurrently discharged) on or onto all the pixels PX using the organic light emitting ink discharge mechanism 20A, the fabrication processing time can be reduced.

Next, a method for fabricating an organic light emitting display device according to still another embodiment of the present invention will be described.

Compared to the method for fabricating an organic light emitting display device according to an embodiment of the present invention as described above, the method for fabricating an organic light emitting display device according to still another embodiment of the present invention has similar steps except for an organic light emitting layer forming step. Accordingly, in describing the method for fabricating an organic light emitting display device according to still another embodiment of the present invention, only the organic light emitting layer forming step will be described.

FIGS. 18 to 21 are cross-sectional views of an organic light emitting layer forming step of a method for fabricating an organic light emitting display device according to still another embodiment of the present invention.

Referring to FIGS. 18 to 21, the organic light emitting layer forming step includes forming the organic light emitting layer 140 on the first electrode 120 that is exposed by (e.g., in an area exposed by) the opening 131 of the pixel-defining film 130. The organic light emitting layer forming step may include an ink non-reactive solvent discharge step and an organic light emitting ink discharge step.

Figure 18:
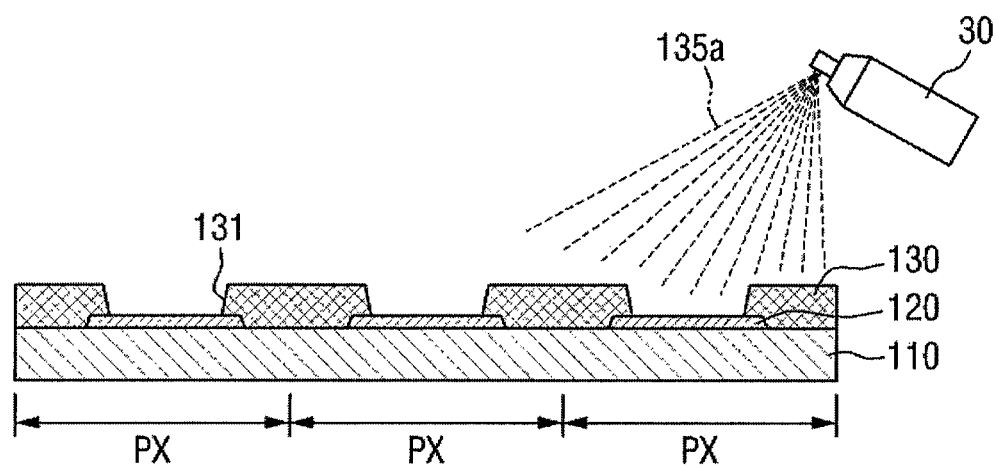
FIGS. 18 to 21 are cross-sectional views of an organic light emitting layer forming step of a method for fabricating an organic light emitting display device according to still another embodiment of the present invention.
Figure 19:
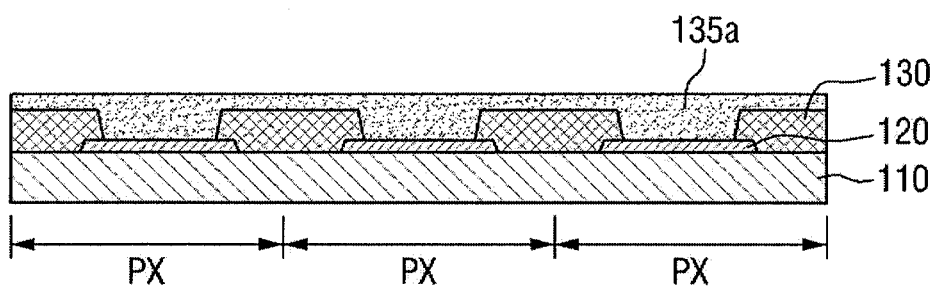

As illustrated in FIG. 18, the ink non-reactive solvent discharge step includes discharging the ink non-reactive solvent 135a on the entire or whole surfaces (e.g., entire exposed surfaces) of both the first electrode 120 and the pixel-defining film 130. Discharging the ink non-reactive solvent 135a may be performed using a spray coating method using a spray device 30. Through discharging the ink non-reactive solvent 135, as illustrated in FIG. 19, the ink non-reactive solvent portion 135 may cover or substantially cover the first electrode 120 and the pixel-defining film 130 and may be formed with a substantially constant thickness from (e.g., measured from) the upper surface of the pixel-defining film 130. In some embodiments, forming the ink non-reactive solvent portion 135 may be performed using a dipping method in which the substrate 110, on which the first electrode 120 and the pixel-defining film 130 are formed, is dipped into the ink non-reactive solvent 135a.

Figure 20:
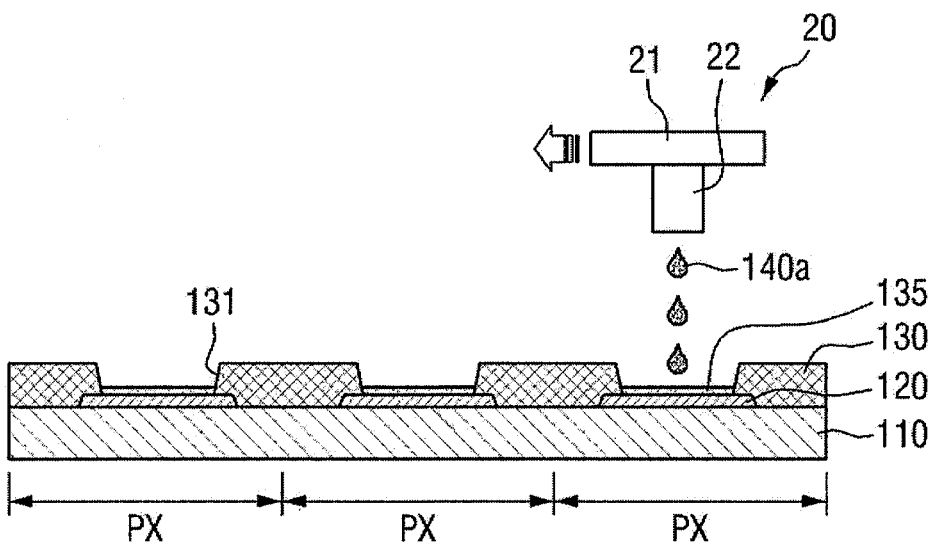
Figure 21:
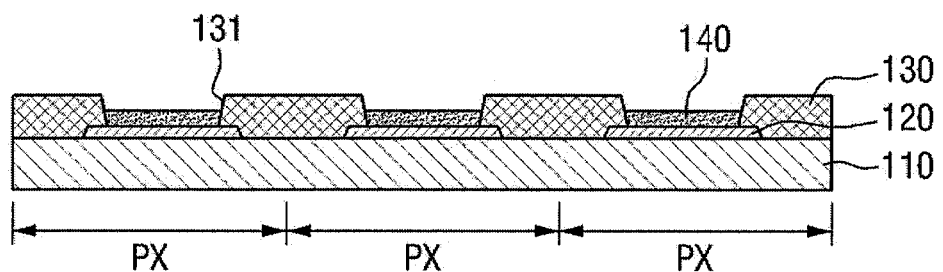

As illustrated in FIG. 20, the organic light emitting ink discharge step includes discharging the organic light emitting ink 140a on or onto the ink non-reactive solvent portion 135 that is formed on the first electrode 120. The ink non-reactive solvent portion 135, which has a large thickness from (e.g., measured from) the first electrode 120 as shown in FIG. 19, is dried (e.g., evaporated) within several seconds, and thus can remain on the first electrode 120 having thin thickness. Discharging the organic light emitting ink 140a may be performed using a method as illustrated in FIG. 7. Through the movement of the organic light emitting ink discharge mechanism 20, the organic light emitting ink 140a is discharged on or onto the ink non-reactive solvent portion 135 of all pixels PX to form the organic light emitting layer 140 as illustrated in FIG. 21. The solvents of the ink non-reactive solvent portion 135 and the solvents of the organic light emitting ink 140a, which are mixed due to the discharging of the organic light emitting ink 140a, are all evaporated (e.g., entirely evaporated) through a drying step (e.g., timed drying step) or the like, and the solids of the organic light emitting ink 140a remain as the organic light emitting layer 140.

As described above, according to the method for fabricating an organic light emitting display device according to still another embodiment of the present invention, because the ink non-reactive solvent portion 135a is formed on the first electrode 120 using a simple method, such as the spray coating method using the spray device 30 or the dipping method, the fabrication processing time can be reduced.

Next, a method for fabricating an organic light emitting display device according to still another embodiment of the present invention will be described.

Compared to the method for fabricating an organic light emitting display device according to an embodiment of the present invention as described above, the method for fabricating an organic light emitting display device according to still another embodiment of the present invention has similar steps except for an organic light emitting layer forming step. Accordingly, in describing the method for fabricating an organic light emitting display device according to still another embodiment of the present invention, only the organic light emitting layer forming step will be described.

Figure 22:
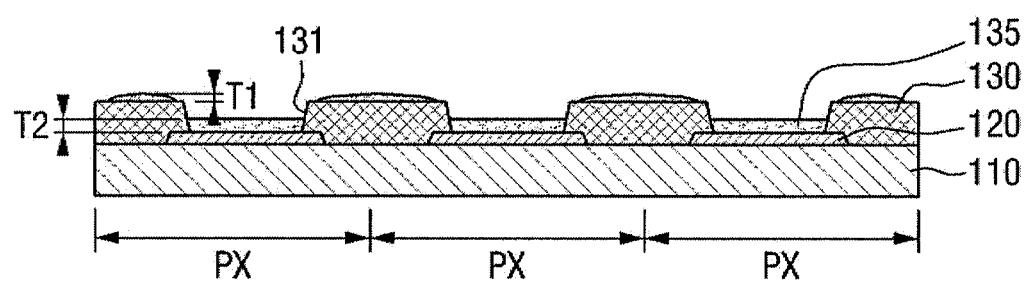
FIGS. 22 to 24 are cross-sectional views of an organic light emitting layer forming step of a method for fabricating an organic light emitting display device according to still another embodiment of the present invention.
Figure 23:
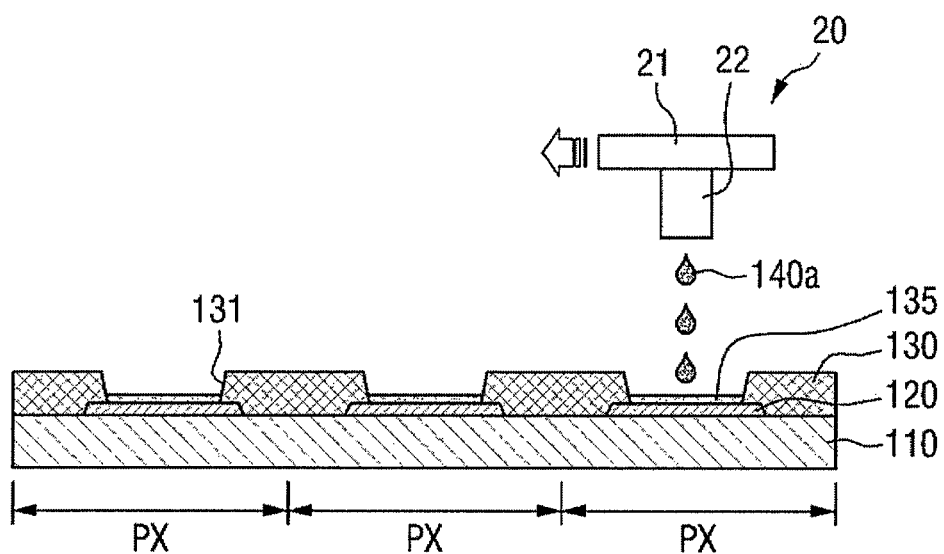
Figure 24:
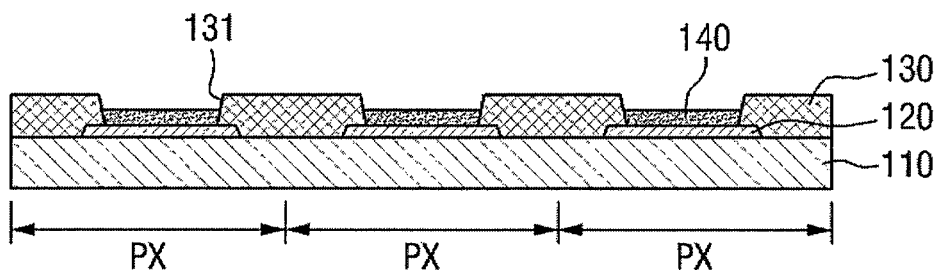

FIGS. 22 to 24 are cross-sectional views of an organic light emitting layer forming step of a method for fabricating an organic light emitting display device according to still another embodiment of the present invention.

Referring to FIGS. 22 to 24, the organic light emitting layer forming step includes forming of the organic light emitting layer 140 on the first electrode 120 that is exposed by the opening 131 of the pixel-defining film 130. The organic light emitting layer forming step may include an ink non-reactive solvent discharge step and an organic light emitting ink discharge step.

The ink non-reactive solvent discharge step includes discharging the ink non-reactive solvent (135a in FIG. 18) onto the entire or whole surfaces (e.g., entire exposed surfaces) of both the first electrode 120 and the pixel-defining film 130, and as illustrated in FIG. 22, the ink non-reactive solvent portion 135 is formed on the upper surfaces of (e.g., at the tops of) the pixel-defining film 130 and the first electrode 120 having a thin thickness. Discharging the ink non-reactive solvent 135a may be performed using the spray coating method using the spray device 30 of FIG. 18. Here, the ink non-reactive solvent portion 135 is formed on the upper surface of the pixel-defining film 130 (e.g., at the top of the pixel-defining film 130) having thin thickness, and a part of the ink non-reactive solvent 135a of the ink non-reactive solvent portion 135 formed on the upper surface of the pixel-defining film 130 (e.g., at the top of the pixel-defining film 130) moves (e.g., flows or migrates) to an upper portion of the first electrode 120 (e.g., a top of the first electrode 120). Accordingly, a second thickness T2 of the ink non-reactive solvent portion 135 that is formed on the first electrode 120 is thicker than a first thickness T1 of the ink non-reactive solvent portion 135 that is formed on the upper surface of the pixel-defining film 130. Because the ink non-reactive solvent portion 135 that is formed on the upper surface of the pixel-defining film 130 has a thin thickness, it may be dried (e.g., evaporated) before the organic light emitting ink discharge step is performed or during the organic light emitting ink discharge step.

As illustrated in FIG. 23, the organic light emitting ink discharge step includes discharging the organic light emitting ink 140a on or onto the ink non-reactive solvent portion 135 that is formed by discharging the ink non-reactive solvent 135a on or onto the first electrode 120. Discharging the organic light emitting ink 140a may be performed using a method as illustrated in FIG. 7. Through the movement of the organic light emitting ink discharge mechanism 20, the organic light emitting ink 140a is discharged on or onto the ink non-reactive solvent portion 135 of all pixels PX to form the organic light emitting layer 140 as illustrated in FIG. 24. The solvents of the ink non-reactive solvent portion 135 and the solvents of the organic light emitting ink 140a, which are mixed due to the discharging of the organic light emitting ink 140a, are all evaporated (e.g., entirely evaporated) through a drying step (e.g., timed drying step) or the like, and the solids of the organic light emitting ink 140a remain as the organic light emitting layer 140.

As described above, according to the method for fabricating an organic light emitting display device according to still another embodiment of the present invention, because the ink non-reactive solvent portion 135 is formed on the first electrode 120 using a simple method, such as the spray coating method using the spray device 30, the fabrication processing time can be reduced.

Next, an inkjet print device that can be used in the method for fabricating an organic light emitting display device according to an embodiment of the present invention will be described.

Figure 25:
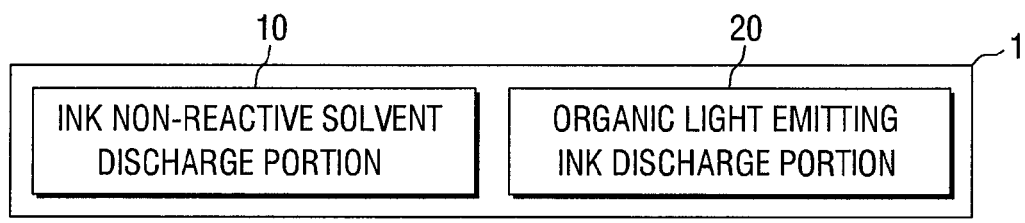
FIG. 25 is a diagram illustrating the schematic configuration of an inkjet print device used in a method for fabricating an organic light emitting display device according to an embodiment of the present invention.
Figure 26:
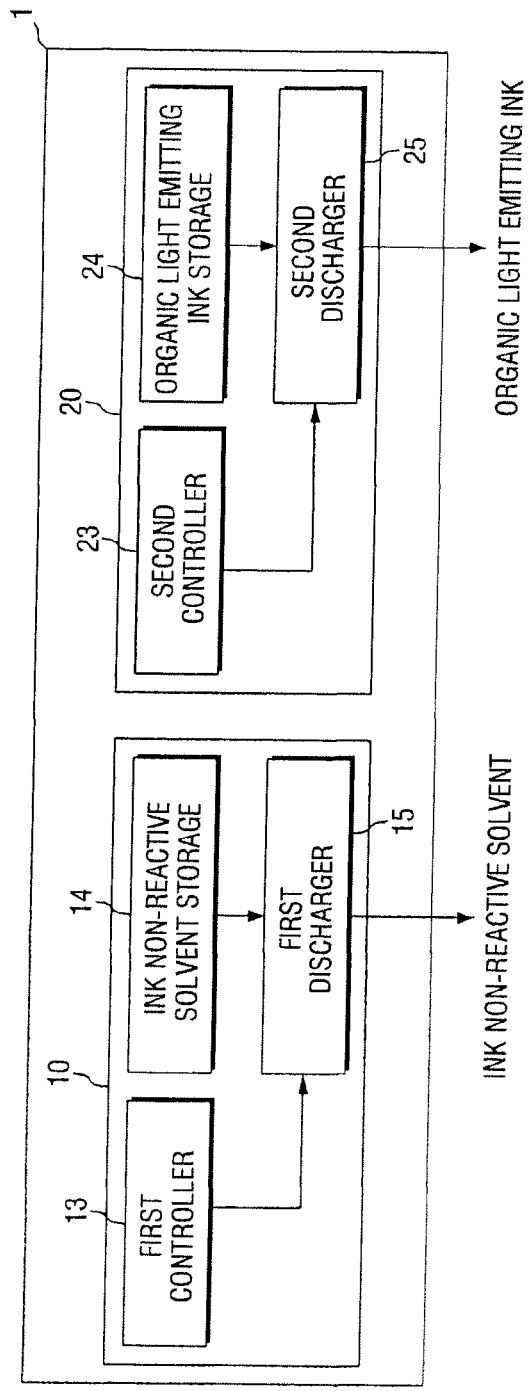
FIG. 26 is a diagram illustrating the detailed configuration of an inkjet print device of FIG. 25.
Figure 27:
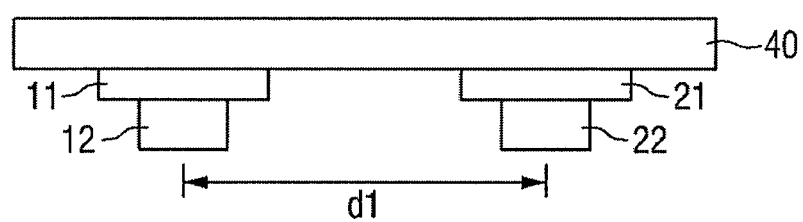
FIG. 27 is a cross-sectional view illustrating an example of the inkjet print device of FIG. 26.

FIG. 25 is a diagram illustrating the schematic configuration of an inkjet print device used in a method for fabricating an organic light emitting display device according to an embodiment of the present invention. FIG. 26 is a diagram illustrating the detailed configuration of an inkjet print device of FIG. 25, and FIG. 27 is a cross-sectional view illustrating an example of the inkjet print device of FIG. 26.

Referring to FIG. 25, an inkjet print device 1 used in a method for fabricating an organic light emitting display device according to an embodiment of the present invention includes an ink non-reactive solvent discharge mechanism 10 and an organic light emitting ink discharge mechanism 20.

Referring to FIG. 26, the ink non-reactive solvent discharge mechanism 10 may include a first controller 13, an ink non-reactive solvent storage 14, and a first discharger 15.

The first controller 13 performs discharge control corresponding to the ink non-reactive solvent through the first discharger 15 and movement control corresponding to the first discharger 15. The discharge control corresponding to the ink non-reactive solvent may include (e.g., mean) the control of viscosity or a flow rate of the ink non-reactive solvent and a discharge amount of the ink non-reactive solvent.

The ink non-reactive solvent storage 14 stores the ink non-reactive solvent to be discharged on or onto the opening of the pixel-defining film exposing the first electrode formed on the substrate of the organic light emitting display device.

The first discharger 15 receives a discharge control signal corresponding to the ink non-reactive solvent and a movement control signal corresponding to the first discharger 15 from the first controller 13, receives the ink non-reactive solvent from the ink non-reactive solvent storage 14, and discharges the ink non-reactive solvent on or onto the first electrode. The first discharger 15 may include the first nozzle 12 that is on (e.g., installed at) the lower portion of the first head 11 (e.g., the bottom of the first head 11) of FIG. 6 to discharge the ink non-reactive solvent according to the discharge control signal corresponding to the ink non-reactive solvent. Further, the first discharger 15 may include a moving device coupled (e.g., connected) to the first head 11 to move the first head 11 in a direction according to the movement control signal corresponding to the first discharger 15.

The organic light emitting ink discharge mechanism 20 may include a second controller 23, an organic light emitting ink storage 24, and a second discharger 25.

The second controller 23 performs discharge control corresponding to the organic light emitting ink through the second discharger 25 and movement control corresponding to the second discharger 25. The discharge control corresponding to the organic light emitting ink may include (e.g., mean) the control of viscosity or a flow rate of the organic light emitting ink and a discharge amount of the organic light emitting ink.

The organic light emitting ink storage 24 stores the organic light emitting ink to be discharged on or onto the ink non-reactive solvent portion that is formed by discharging the ink non-reactive solvent on or onto the opening of the pixel-defining film exposing the first electrode formed on the substrate of the organic light emitting display device.

The second discharger 25 receives a discharge control signal corresponding to the organic light emitting ink and a movement control signal corresponding to the second discharger 25 from the second controller 23, receives the organic light emitting ink from the organic light emitting ink storage 24, and discharges the organic light emitting ink on or onto the ink non-reactive solvent portion. The second discharger 25 may include the second nozzle 22 that is on (e.g., installed at) the lower portion of the second head 21 (e.g., the bottom of the second head 21) of FIG. 7 so as to discharge the organic light emitting ink according to the discharge control signal corresponding to the organic light emitting ink. Further, the second discharger 25 may include a moving device coupled (e.g., connected) to the second head 21 to move the second head 21 in a direction in accordance with the movement control signal corresponding to the second discharger 25.

In some embodiments, the movement of the first discharger 15 and the movement of the second discharger 25 may be independently controlled by the moving device coupled (e.g., connected) to the first head 11 and the moving device coupled (e.g., connected) to the second head 21.

Further, referring to FIG. 27, the movement of the first discharger 15 and the movement of the second discharger 25 may be performed (e.g., simultaneously or concurrently performed) when (e.g., in a state where) the first head 11 and the second head 21 are coupled to a moving device 40. In this case, the distance dl between the first nozzle 12 on (e.g., installed at) the lower portion of the first head 11 (e.g., the bottom of the first head 11) and the second nozzle 22 on (e.g., installed at) the lower portion of the second head 21 (e.g., the bottom of the second head 21) may be substantially equal to the width of each pixel PX on the substrate of the organic light emitting display device.

In concluding the detailed description, those skilled in the art will appreciate that many variations and modifications can be made to the preferred embodiments without substantially departing from the principles of the present invention. Therefore, the disclosed preferred embodiments of the invention are to be used in a generic and descriptive sense only and not for purposes of limitation.

What is claimed is:

1. An inkjet print device comprising:
an ink non-reactive solvent discharge mechanism comprising a first nozzle and being configured to form an ink non-reactive solvent portion by discharging ink non-reactive ink in an opening of a pixel-defining film and on a first electrode, the opening exposing the first electrode on a substrate of an organic light emitting display device; and
an organic light emitting ink discharge mechanism comprising a second nozzle and being configured to form an organic light emitting layer by discharging an organic light emitting ink on the ink non-reactive solvent portion,
wherein the ink non-reactive solvent discharge mechanism and the organic light emitting ink discharge mechanism are configured to move in a first direction,
wherein the first nozzle and the second nozzle are coupled to one moving device and are adjacent to each other in the first direction, and
wherein a distance between the first nozzle and the second nozzle is equal to a width of a pixel, the width of the pixel being equal to a distance between adjacent openings of the pixel-defining film.

2. The inkjet print device of claim 1, wherein the ink non-reactive solvent discharge mechanism comprises:
a first controller configured to control discharge of an ink non-reactive solvent;
an ink non-reactive solvent storage configured to store the ink non-reactive solvent; and
a first discharger configured to receive a discharge control signal from the first controller, to receive the ink non-reactive solvent from the ink non-reactive solvent storage, and to discharge the ink non-reactive solvent on the first electrode.

3. The inkjet print device of claim 2, wherein the organic light emitting ink discharge mechanism comprises:

a second controller configured to control discharge of the organic light emitting ink;

an organic light emitting ink storage configured to store the organic light emitting ink; and a second discharger configured to receive a discharge control signal from the second controller, to receive the organic light emitting ink from the organic light emitting ink storage, and to discharge the organic light emitting ink on the ink non-reactive solvent portion.

4. The inkjet print device of claim 3, wherein the first discharger comprises the first nozzle at a lower portion of a first head, and the second discharger comprises the second nozzle at a lower portion of a second head, and the first head and the second head coupled to the moving device.

5. The inkjet print device of claim 4, wherein the moving device is configured to receive a movement control signal from at least one of the first controller or the second controller.

* * * * *